SEMICONDUCTOR DEVICE HAVING LOW CAPACITANCE JUNCTION

Filed May 15, 1968

INVENTOR.
NORIYOSHI KITAGAWA
BY
Hopgood & Calimafde
ATTORNEYS

United States Patent Office 3,515,957

Patented June 2, 1970

3,515,957

SEMICONDUCTOR DEVICE HAVING LOW CAPACITANCE JUNCTION

Noriyoshi Kitagawa, Tokyo, Japan, assignor to Nippon Electric Company, Limited, Tokyo, Japan, a corporation of Japan Filed May 15, 1968, Ser. No. 729,294
Claims priority, application Japan, May 19, 1967, 42/31,825
Int. Cl. H01l *11/00*
U.S. Cl. 317—235 9 Claims

ABSTRACT OF THE DISCLOSURE

A semiconductor device having a very low junction capacitance and a method for making same is described wherein a pair of junction forming semiconductor materials are placed on a surface of an insulating substrate with the junction extending substantially transverse to the substrate surface. A specific circular configuration is described.

DETAILED DESCRIPTION OF INVENTION

This invention relates to a junction-type semiconductor device whose capacitance is minute and whose area for leading out an electrode is large.

The capacitance of a junction of a conventional semiconductor device is influenced by the concentration distribution of the impurity contained in the semiconductor, and is proportional to the area of the p-n junction face of the element. Specifically, the capacitance of the junction type semiconductor device to be used in the super high frequency region is required to be extremely small such as less than 0.5 picofarad. For this purpose, the area of the p–n junction face of the device must be less than, for example, $7\times10^{-6}$ square centimeters (cm.$^2$). For instance, when the p-n junction face is circular, the p-n junction face should be less than $3\times10^{-3}$ cm. in its diameter. A semiconductor device having a minute capacitance have ever been obtained only by resorting to the point contact semiconductor device. In many cases, however, the semiconductor device of the junction type is more desirable in view of various characteristics and reliability. Practically, it is very difficult to conduct accurately the connection process, by applying the usual connection technique such as a bonding process adapted for a junction type semiconductor device, at the electrode lead out portion which has such a minute area. As to the known semiconductor device such as a mesa structure, the same problem is also involved in the electrode lead out process.

It is therefore a principal object of this invention to provide a low capacitance junction type semiconductor device in which the size of the surface area of the electrode lead out portion can be arbitrarily determined regardless of the p-n junction area, even when the electrostatic capacity is minute.

It is a further object of this invention to provide a method of making a low capacitance semiconductor junction.

These objects are accomplished by my invention which is described as follows in conjunction with the drawings, wherein FIG. 1 is a longitudinal cross-sectional view of the conventional planar semiconductor device;

Figure 2:
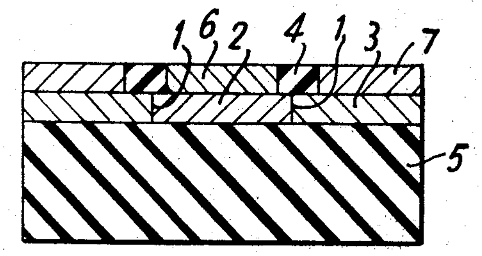
FIG. 2 is a longitudinal cross-sectional view illustrating a junction type semiconductor device embodying this invention.

FIGS. 4(A) through 4(G) are longitudinal cross-sectional views observed at each stage of the manufacturing process of the semiconductor device as in FIG. 2.

A semiconductor device obtainable according to this invention is such that at least a first conduction type region (e.g., p-type) and a second conduction type region (e.g., n-type) being different from said first conduction type are formed in a semiconductor material installed on a main face of a single crystal insulating material; the boundary face of said first and second conduction type regions are nearly perpendicular to the main face of said single crystal insulating material; the electrode lead out portions of said respective first and second conduction type regions are attached to the respective upper faces of the regions, and the surface areas of the respective electrode lead out portions are larger than the area of said boundary face.

In conjunction with the accompanying drawings, the invention will be explained in detail.

Figure 1:
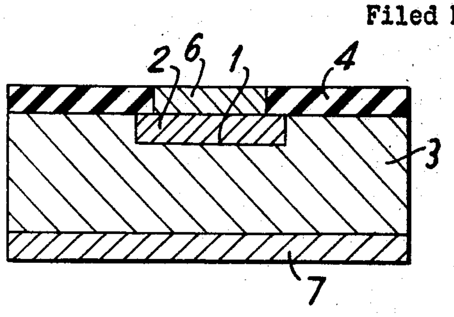

FIG. 1 shows a cross-sectional view of the conventional junction type semiconductor device which has a planar structure. A p-n flat junction face 1 is a boundary formed by a semiconductor region 2 having an arbitrary conduction type (e.g., p-type) and a semiconductor region 3 having the inverse conductor type (e.g., n-type). The top end of said p-n junction is covered by an insulating film 4. An electrode lead out portion 6 for the region 2 is attached to the upper face of the region 2, and the surface area of the electrode lead out portion 6 is nearly equal to that of the flat p-n junction 1. An electrode lead out portion 7 for the region 3 is attached to the bottom face of the region 3. Most of the p-n junction 1 is parallel with the surfaces of these two electrode lead out portions 6 and 7. When such planar structure is desired for a semiconductor device having a minute electrostatic capacity less than 0.5 picofarad, the area of the p-n junction 1 should be made smaller than $7\times10^{-6}$ cm.$^2$ (in case the junction 1 is circular, and the diameter should be less than $3\times10^{-3}$ cm.). Since the surface area of the electrode lead out portion 6 in such a semiconductor device must be less than the area of the junction a lead wire which is to be attached to the electrode lead out portion 6 must also have an extremely minute contacting areas. Needless to say it is very difficult to connect a lead wire efficiently to the electrode lead out portion having only a tiny surface area.

Figure 3:
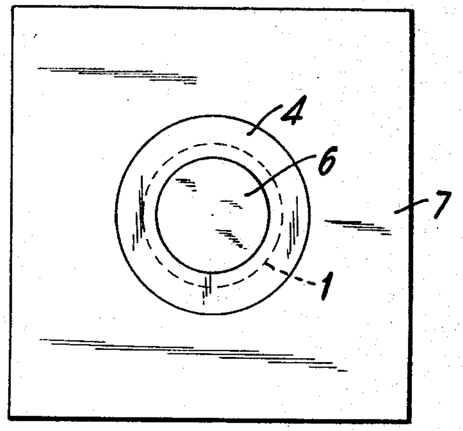
FIG. 3 is a top view of the semiconductor device as in FIG. 2.

Referring to FIGS. 2 and 3 in which a preferred embodiment of this invention is illustrated, a p-n junction 1 is a boundary face formed by a semiconductor region 2 of an arbitrary conduction type (for example, p-type) and a semiconductor region 3 having a conduction type being inverse with respect to said region 2, and both ends of said p-n junction 1 have respectively contact with an insulating film 4 and a single crystal insulating material 5 (such as quartz). The insulating film 4 serves as a protection for the p-n junction face 1 from the exterior environment and maintains stable breakdown voltage and electrostatic characteristics. The single crystal insulating material 5 functions not only as the insulating film 4 but also serves as a base support for the regions 2 and 3. The electrode lead out portion 6 of the region 2 is ohmic contact with the upper face of the region 2. The surface area of the electrode lead out portion 6 is nearly equal to that of the upper face of the region 2. Likewise, the electrode lead out portion 7 of the region 3 having the inverse conduction type is closely attached to the upper face of the region 3. The p-n junction 1 is formed nearly perpendicular to the surfaces of the electrode lead out portions 6 and 7. The single crystal insulating material 5 may be substituted with a non-single crystal insulator. In the formation of the device having insulated base 5 and a body for forming semiconductor regions 2, 3, a semiconductor single crystal base may be roughened or an oxide layer may be disposed on a single crystal semiconductor surface and, thereafter, an insulator such as polycrystal silicon is laid on the surface, whereby the other face of the semiconductor single crystal may be etched. However, for facilitating the production process, it is desirable to grow through vapor-phase process a semiconductor single crystal on a single crystal insulating material.

Figure 4:
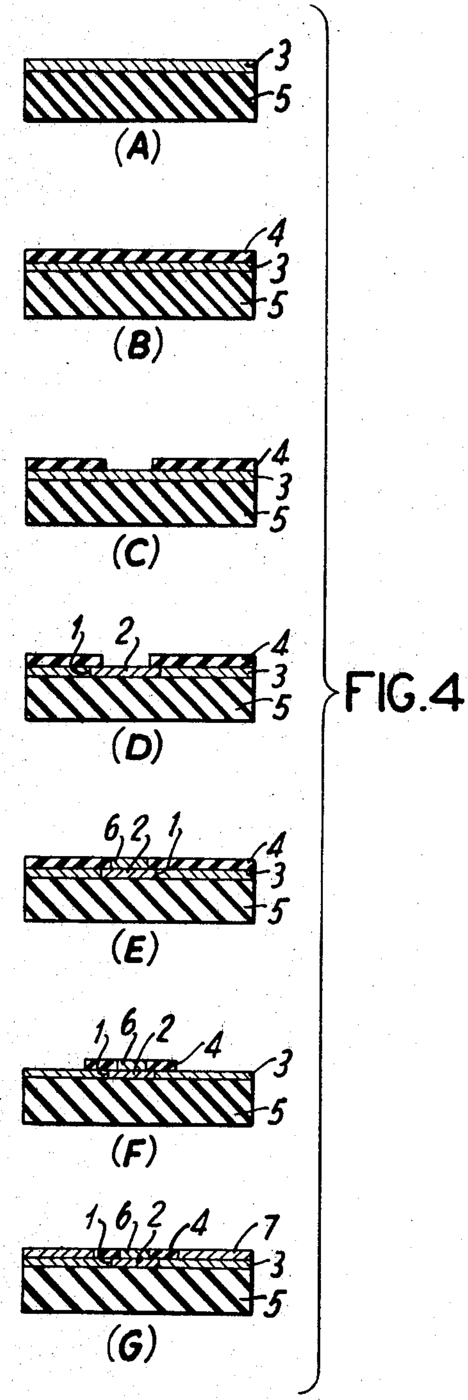

Referring to FIG. 4, the production process for the semiconductor device of this invention as in FIGS. 2 and 3 will be explained below.

As in FIG. 4(A), a silicon single crystal 3 containing phosphor of arbitrary conduction type (e.g., n-type) is formed by epitaxial growth on the quartz base 5 to a desired thickness. Then, a silicon dioxide layer 4 is laid onto the region 3 in the manner as in FIG. 4(B). The silicon dioxide layer 4 is an insulating film formed by reacting silane and nitrogen dioxide at about 500° C. As shown in FIG. 4(C), the insulating film 4 is partly removed by photo-etching process. The size of the window formed by this process is determined by the desired electrostatic capacity of the element and the thickness of the region 3. Also as shown in FIG. 4(D), an impurity such as boron which induces the other conduction type (e.g., p-type) being inverse with respect to the region 3 is penetrated into the region 3 through said window, to form a region 2 whose conduction type is inverse with respect to the region 3. Through this process, a p-n junction 1 is formed at the boundary of the two regions 2 and 3. In this case, it is necessary that the bottom surface of the region 2 reaches the upper face of the insulating material 5. It is desirable that the resistivity or thickness of the region 3 should not be changed while penetrating the impurity therein. In this view, the impurity penetrating process, when done by diffusion, should be completed quickly at a low diffusion temperature. For example, when boron is used as the diffusing impurity, the vapor-phase diffusion of boron-trichloride obtaining a high surface concentration should be applied thereto. Now, an electrode lead out portion 6 is formed by evaporating an aluminum film on the surface of the region 2 as shown in FIG. 4(E). This aluminum film should have ohmic contact with the region 2. Part of the insulating film 4 is removed by a photo-etching process as in FIG. 4(F). In this case, the distance from the circumference of the insulating film 4, which remains in the form of a ring, to the p-n junction 1 should be long enough so that the breakdown voltage and electrostatic capacity of the element can be maintained. As shown in FIG. 4(G), an aluminum film 7 is attached to the part from which the the insulating film has been removed, to form an electrode lead out portion 7. This aluminum film should have ohmic contact with the region 3. According to an example, when the shape of the region 2 is circular, the thickness of the semiconductor single crystal 3 $5\times10^{-5}$ cm., and the upper face area of the region 2 $7.8\times10^{-5}$ cm.$^2$ (equivalent to $10^{-2}$ cm. in diameter), the junction capacitance can be made approximately 0.1 picofarad. The area of the electrode lead out portion 6 formed in said manner on the upper face of the region 2 permits easy lead out of the electrode therefrom. The semiconductor device of this invention has two principal features as follows in comparison with the conventional semiconductor device.

First; referring to FIG. 1 in which a conventional semiconductor device is shown, most of the p-n junction 1 is parallel with the surfaces of the electrode lead out portions 6 and 7, whereas in FIG. 2 in which a semiconductor of this invention is shown, the p-n junction 1 is nearly perpendicular to the surfaces of the electrode lead out portions 6 and 7.

Second; in the element of this invention as in FIG. 2, the lead out portion 7 is located at the upper face, whereas in the conventional one as in FIG. 1, the electrode lead out portion 7 is located at the lower face.

The area of the electrode lead out portion of the semiconductor device according to this invention may be enlarged as follows. Referring to FIG. 1, assume that the diameter of the p-n junction 1 of the conventional semiconductor device is D. Then, the area of the p-n junction face must be $\frac{1}{4}\pi D^2$. Therefore, the diameter of the electrode lead out portion 6 is roughly D, and its surface area is roughly $\frac{1}{4}\pi D^2$. Now, referring to FIG. 2, assume that the height of the region 2 of an arbitrary conduction type of the semiconductor device according to this invention is $h$ and its diameter is $d$. Then, the area of the p-n junction 1 must be $\pi dh$, and the diameter of the electrode lead out portion 6 is nearly $d$, and its surface area is nearly $\frac{1}{4}\pi d^2$. When the areas of the p-n junctions 1 of the conventional semiconductor device of FIG. 1 and of the semiconductor device of this invention as in FIG. 2 are made equal to each other, the diameter $d$ of the region according to this invention is made longer than four times the height $h$ so that the surface area of the lead out portion 6 of the device of the invention is larger than that of the conventional one. Generally, when, according to this invention, the diameter $d$ of the region 2 is $n$-times its height, the diameter $d$ of the electrode lead out portion 6 of the device of this invention is $\sqrt{n/2}$ times the diameter D of the electrode lead out portion of the conventional device. Therefore the semiconductor device of this invention is more usefully featured with a large ratio of $d$ versus $h$. For example, when $d$ is 100 times the value of $h$, the diameter D ($2\times10^{-3}$ cm.) of the electrode lead out portion 6 of the conventional semiconductor device can be made $10^{-2}$ cm. according to the device of this invention. This shows that the diameter of the electrode lead out portion may be enlarged fivefold.

Referring to FIGS. 2 and 3, the purpose of the insulating film 4 is to protect the p-n junction 1 from the exterior environment, and to maintain the breakdown voltage and the electrostatic capacity of the semiconductor device to be constant. Therefore, removal of this insulating film therefrom will cause no reduction of the effect of this invention. Also, referring to FIGS. 2 and 3, even if the plane view of the semiconductor device of this invention is not a circle but of an arbitrary figure, the effect of this invention will be unchanged on condition that the surface area of the electrode lead out portion 6 is larger than the area of the p-n junction face 1. It is needless to say that the purpose of this invention can be achieved only if the surface area of the respective electrode lead out portions 6 and 7 of the semiconductor regions 2 and 3 are larger than the area of the p-n junction face 1 even when the region of a semiconductor having inverse conduction type (e.g., n-type), as in the case of the semiconductor device of this invention of FIGS. 2 and 3, does not surround a semiconductor region 2 having an arbitrary conduction type (e.g., p-type).

According to this invention, a silicon epitaxial layer containing a n-type impurity is formed through epitaxial growth process on the surface of a thin quartz substrate and, after this, photo-etching process and various diffusion processes are repeatedly carried out, to form a collector region, base region and emitter region whereby a transistor may be obtained. This transistor is suitably applicable to the super high frequency region because the value of the junction capacitance can be made remarkably low.

To obtain a semiconductor device by forming a semiconductor material on the surface of a single crystal insulating material through epitaxial growth process, the thickness of the epitaxial layer obtainable is about 0.2 micron minimum. According to this invention, the capacitance of the semiconductor device at said thickness can be reduced to less than 0.1 picofarad. However, it is to be noted that if the thickness of the epitaxial layer is reduced to less than 0.2 micron, the characteristics of the epitaxial layer are often impaired. When a single crystal semiconductor material is available from the polycrystal insulating material, it will become possible to provide a more economical semiconductor device. This invention permits formation of various semiconductor devices whose electrode lead out area can be made large in spite of small junction capacitance. This represents an advantage which has great utility especially when the invention is applied to the super high frequency semiconductor device.

While an embodiment of this invention has been illustrated and described in detail, it is particularly understood that this invention is not limited thereto or thereby but the scope of this invention covers all the semiconductor devices as described in the following claims.

I claim:

1. A semiconductor device having a low junction capacitance comprising a substrate made of an insulating material, a first circular semiconductor material of a first conductivity type with said first material located on one surface of said substrate material, a second semiconductor material surrounding said first semiconductor material and located in substantial coplanar relationship with the first material on the one substrate surface and having a conductivity opposite to said first conductivity type semiconductor material, with said second material forming an annular semiconductor junction with the first material and with the junction substantially perpendicular to and extending to said one substrate surface, and an electrode in ohmic contact with an exposed surface of said first semiconductor material and having a surface area larger than the area of the annular semiconductor junction formed between the said first and second semiconductor materials.

2. The device as recited in claim 1 and further including a layer of junction protection material placed on portions of said semiconductor materials and the junction.

3. The device as recited in claim 1 wherein the capacitance of the junction is of the order of less than 0.5 picofarad.

4. The device as recited in claim 1 wherein the junction area is of the order of less than $7\times10^{-6}$ cm.$^2$.

5. The device as recited in claim 1 wherein the semiconductor materials are thin film layers.

6. The device as recited in claim 5 wherein the second material of the opposite conductivity is positioned as a region in said first material.

7. The device as recited in claim 1 wherein the second material region has a surface diameter greater than four times the thickness of the junction.

8. The device as recited in claim 1 wherein the substrate material is formed of a single crystal insulating material.

9. The device as recited in claim 8 wherein the semiconductor materials are epitaxially formed on said substrate surface with a thickness of the order of a fraction of a micron.

References Cited

UNITED STATES PATENTS

| | | | |
|---|---|---|---|
| 3,393,088 | 7/1968 | Manasevit et al. | 117—106 |
| 3,414,434 | 12/1968 | Manasevit | 117—201 |
| 3,409,812 | 11/1968 | Zuleeg | 317—235 |

OTHER REFERENCES

Rainer Zuleeg, Electronics, Mar. 20, 1967, pp. 106, 107.

Zuleeg, Solid State Electronics, Pergamon Press 1967, vol. 10, 449–460 (Great Britain).

JOHN W. HUCKERT, Primary Examiner

B. ESTRIN, Assistant Examiner

U.S. Cl. X.R.

317—234